US012607484B2

(12) United States Patent
Niu et al.

(10) Patent No.: US 12,607,484 B2
(45) Date of Patent: Apr. 21, 2026

(54) PIEZOELECTRIC SENSOR WITH REDUCED PROCESS DIFFICULTY AND MANUFACTURING METHOD THEREFOR, AND DETECTION APPARATUS

(71) Applicant: BOE TECHNOLOGY GROUP CO., LTD., Chaoyang District (CN)

(72) Inventors: Jing Niu, Beijing (CN); Tingting Zhou, Beijing (CN); Fangzhen Zhang, Beijing (CN); Jintao Peng, Beijing (CN)

(73) Assignee: BOE Technology Group Co., Ltd., Chaoyang District (CN)

( * ) Notice: Subject to any disclaimer, the term of this patent is extended or adjusted under 35 U.S.C. 154(b) by 1058 days.

(21) Appl. No.: 17/765,269

(22) PCT Filed: May 12, 2021

(86) PCT No.: PCT/CN2021/093318
§ 371 (c)(1),
(2) Date: Mar. 30, 2022

(87) PCT Pub. No.: WO2022/001390
PCT Pub. Date: Jan. 6, 2022

(65) Prior Publication Data
US 2022/0364885 A1 Nov. 17, 2022

(30) Foreign Application Priority Data
Jun. 29, 2020 (CN) ......................... 202010603068.4

(51) Int. Cl.
| | |
|---|---|
| *G01D 5/14* | (2006.01) |
| *H01L 27/20* | (2006.01) |
| *H01L 41/047* | (2006.01) |
| *H01L 41/113* | (2006.01) |
| *H01L 41/187* | (2006.01) |
| *H01L 41/29* | (2013.01) |
| *H01L 41/311* | (2013.01) |

(Continued)

(52) U.S. Cl.
CPC ............... *G01D 5/14* (2013.01); *H10N 30/06* (2023.02); *H10N 30/071* (2023.02);
(Continued)

(58) Field of Classification Search
CPC .......... G01D 5/14; H10N 39/00; H10N 30/06; H10N 30/071; H10N 30/302; H10N 30/308; H10N 30/878; H10N 30/8554
(Continued)

(56) References Cited

U.S. PATENT DOCUMENTS

| | | |
|---|---|---|
| 2001/0028285 A1 | 10/2001 | Klee et al. |
| 2007/0152537 A1 | 7/2007 | Yamaguchi et al. |

(Continued)

FOREIGN PATENT DOCUMENTS

| | | |
|---|---|---|
| CN | 1383610 A | 12/2002 |
| CN | 101024481 A | 8/2007 |

(Continued)

*Primary Examiner* — Emily P Pham
*Assistant Examiner* — Monica Mata
(74) *Attorney, Agent, or Firm* — The Webb Law Firm

(57) ABSTRACT

A piezoelectric sensor and a manufacturing method therefor, and a detection apparatus, which relate to the technical field of sensing. The piezoelectric sensor includes: an array substrate; a first capping layer located on the array substrate and including a first portion and a second portion, wherein the first portion covers the array substrate, a cavity is provided between the second portion and the array substrate, and the second portion is provided with a first opening; a first electrode located above the first capping layer and above the cavity, a piezoelectric thin film located on the first electrode; and a second electrode located on the piezoelectric thin film.

19 Claims, 9 Drawing Sheets

(51) Int. Cl.

| | |
|---|---|
| *H10N 30/06* | (2023.01) |
| *H10N 30/071* | (2023.01) |
| *H10N 30/30* | (2023.01) |
| *H10N 30/853* | (2023.01) |
| *H10N 30/87* | (2023.01) |
| *H10N 39/00* | (2023.01) |

(52) U.S. Cl.
CPC ......... *H10N 30/302* (2023.02); *H10N 30/308* (2023.02); *H10N 30/8554* (2023.02); *H10N 30/878* (2023.02); *H10N 39/00* (2023.02)

(58) Field of Classification Search
USPC ......................................................... 310/311
See application file for complete search history.

(56) References Cited

U.S. PATENT DOCUMENTS

| | | | |
|---|---|---|---|
| 2013/0113577 A1 | 5/2013 | Adkisson et al. | |
| 2013/0136280 A1* | 5/2013 | Stephanou ............ | G06F 1/1637 |
| | | | 29/25.35 |
| 2015/0015118 A1 | 1/2015 | Kamijo | |
| 2018/0191322 A1 | 7/2018 | Chang et al. | |

FOREIGN PATENT DOCUMENTS

| | | | |
|---|---|---|---|
| CN | 104283525 A | 1/2015 | |
| CN | 108121976 A | 6/2018 | |
| CN | 108270414 A | 7/2018 | |
| CN | 109993156 A | 7/2019 | |

* cited by examiner

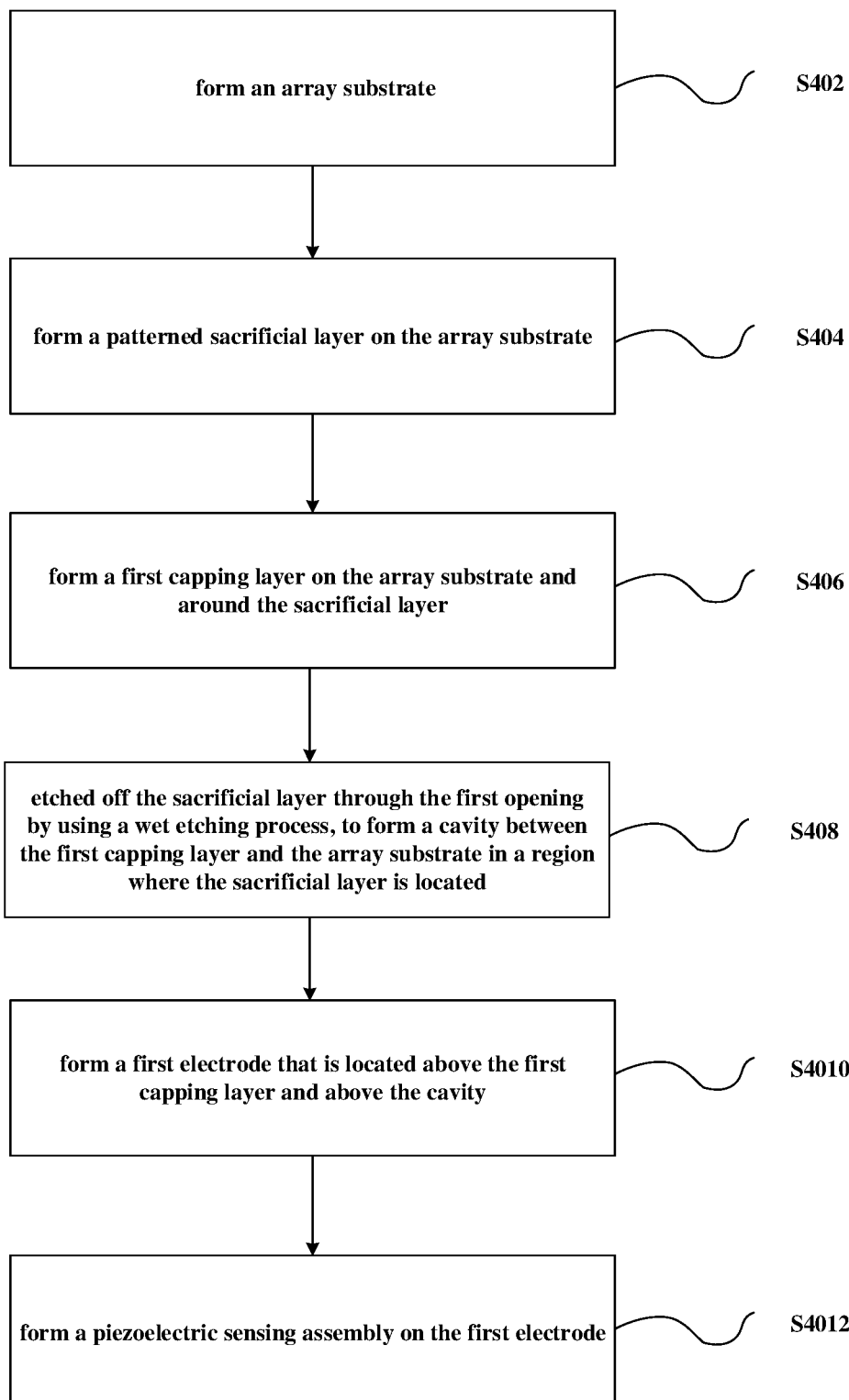

form an array substrate    S402 form a patterned sacrificial layer on the array substrate    S404 form a first capping layer on the array substrate and around the sacrificial layer    S406 etched off the sacrificial layer through the first opening by using a wet etching process, to form a cavity between the first capping layer and the array substrate in a region where the sacrificial layer is located    S408 form a first electrode that is located above the first capping layer and above the cavity    S4010 form a piezoelectric sensing assembly on the first electrode    S4012

PIEZOELECTRIC SENSOR WITH REDUCED PROCESS DIFFICULTY AND MANUFACTURING METHOD THEREFOR, AND DETECTION APPARATUS

CROSS-REFERENCE TO RELATED APPLICATIONS

This application is the U.S. National phase Application of International Patent Application No. PCT/CN2021/093318 filed May 12, 2021, which claims priority to Chinese Patent Application No. 202010603068.4 filed on Jun. 29, 2020, the disclosures of which are hereby incorporated by reference in their entirety.

TECHNICAL FIELD

This disclosure relates to the field of sensing technology, and particularly, to a piezoelectric sensor, a manufacture method thereof, and a detection device.

BACKGROUND

A piezoelectric sensor is a sensor manufactured by utilizing a piezoelectric effect generated after a piezoelectric material is stressed. When deformation (including bending and stretching deformation) occurs in the piezoelectric material in the piezoelectric sensor under an external force, charges will be generated on a surface of the piezoelectric sensor due to polarization of internal charges. The piezoelectric sensor can measure various dynamic forces, mechanical shocks, and vibrations. The piezoelectric type sensor has advantages of wide frequency band, high sensitivity, high signal-to-noise ratio, simple structure, reliable operation, light weight and the like. The piezoelectric sensor can be widely applied to aspects such as industry, national defense, biomedical detection and the like.

SUMMARY

According to an aspect of embodiments of the present disclosure, there is provided a piezoelectric sensor, comprising: an array substrate; a first capping layer located on the array substrate and comprising a first portion and a second portion, wherein the first portion covers the array substrate, and a cavity is provided between the second portion and the array substrate, and the second portion is provided with a first opening; a first electrode located above the first capping layer and above the cavity; a piezoelectric thin film located on the first electrode; and a second electrode located on the piezoelectric thin film.

In some embodiments, the above piezoelectric sensor further comprises: a first connecting member located above the first portion of the first capping layer; and a second connecting member located above the first capping layer, electrically connected with the first electrode, and electrically insulated from the first connecting member, wherein the array substrate comprises a thin film transistor and a first passivation layer located on the thin film transistor, the thin film transistor comprises a third electrode and a fourth electrode, the cavity is located between the first passivation layer and the first capping layer, the third electrode is electrically connected with the first connecting member through a first contact hole, and the fourth electrode is electrically connected with the second connecting member through a second contact hole.

In some embodiments, the above piezoelectric sensor further comprises a second capping layer. The second capping layer is located at least partially between the first capping layer and the first electrode.

In some embodiments, the first passivation layer comprises a stack layer structure of silicon oxide and silicon oxynitride.

In some embodiments, the piezoelectric sensor further comprises a first planarization layer covering the first capping layer, the first connecting member, the second connecting member, and the second electrode; a first contact electrode located on the first planarization layer and electrically connected with the first connecting member through a third contact hole; and a second contact electrode located on the first planarization layer and electrically connected with the second electrode through a fourth contact hole.

In some embodiments, a material of the first electrode and the second electrode is indium tin metal oxide (ITO).

In some embodiments, the piezoelectric sensor further comprises a fifth electrode. The fifth electrode is located between the first electrode and the piezoelectric thin film.

In some embodiments, the piezoelectric sensor further comprises: a second planarization layer located above the first electrode, the first connecting member, the second connecting member, and the first capping layer; a second passivation layer located on the second planarization layer, the second passivation layer and the second planarization layer being provided with a second opening, the second opening exposing an upper surface of the first electrode; a third contact electrode located on the second planarization layer and electrically connected with the first connecting member through a fifth contact hole; and a fourth contact electrode located on the second planarization layer and electrically connected with the second electrode.

In some embodiments, a material of the first electrode is indium tin metal oxide, and a material of the second electrode and the fifth electrode is platinum.

In some embodiments, a material of the first capping layer is silicon oxide, and a material of the second capping layer is silicon nitride.

In some embodiments, the piezoelectric thin film is a lead zirconate titanate piezoelectric thin film.

According to another aspect of the embodiments of the present disclosure, there is provided a method of manufacturing a piezoelectric sensor, comprising: forming an array substrate; forming a patterned sacrificial layer on the array substrate; forming a first capping layer on the array substrate and around the sacrificial layer, wherein the first capping layer is provided with a first opening around the sacrificial layer; etching off the sacrificial layer through the first opening by using a wet etching process, to form a cavity between the first capping layer and the array substrate, in a region where the sacrificial layer is located; forming a first electrode that is located above the first capping layer and above the cavity; and forming a piezoelectric sensing assembly on the first electrode.

In some embodiments, the forming a first capping layer on the array substrate and around the sacrificial layer comprises: forming the first capping layer on the array substrate and around the sacrificial layer by using plasma enhanced chemical vapor deposition.

In some embodiments, the method of manufacturing the piezoelectric sensor further comprises: forming a second capping layer that is located at least partially between the first capping layer and the first electrode.

In some embodiments, a material of the first capping layer is silicon oxide, and a material of the second capping layer is silicon nitride.

In some embodiments, the forming a piezoelectric sensing assembly on the first electrode comprises: forming a piezoelectric thin film on the first electrode; and forming a second electrode on the piezoelectric thin film.

In some embodiments, the array substrate comprises a thin film transistor and a first passivation layer located on the thin film transistor, the thin film transistor comprises a third electrode and a fourth electrode, and the cavity is located between the first passivation layer and the first capping layer. The method of manufacturing the piezoelectric sensor further comprises: etching the first capping layer, the second capping layer and the first passivation layer to form a first contact hole exposing an upper surface of the third electrode and a second contact hole exposing an upper surface of the fourth electrode; and forming a first connecting member and a second connecting member on the second capping layer, the first connecting member being electrically connected with the third electrode through the first contact hole, the second connecting member being electrically connected with the first electrode and electrically insulated from the first connecting member, the second connecting member being electrically connected with the fourth electrode through the second contact hole.

In some embodiments, the first electrode, the first connecting member, and the second connecting member are formed by a same patterning process.

In some embodiments, the method of manufacturing the piezoelectric sensor further comprises: forming a first planarization layer that covers the first capping layer, the first connecting member, the second connecting member, and the piezoelectric sensing assembly; etching the first planarization layer to form a third contact hole and a fourth contact hole; and forming a first contact electrode and a second contact electrode on the first planarization layer, the first contact electrode being electrically connected with the first connecting member through the third contact hole, the second contact electrode being electrically connected with the second electrode through the fourth contact hole.

In some embodiments, the method of manufacturing the piezoelectric sensor further comprises: forming a second planarization layer that is located above the first electrode, the first connecting member, the second connecting member, and the first capping layer; etching the second planarization layer to form a fifth contact hole; forming a third contact electrode and a fourth contact electrode on the second planarization layer, the third contact electrode being electrically connected with the first connecting member through the fifth contact hole, the fourth contact electrode being electrically insulated from the third contact electrode; forming a second passivation layer that covers the second planarization layer, the third contact electrode and the fourth contact electrode; and etching the second planarization layer and the second passivation layer to form a second opening and a third opening, wherein the second opening exposes an upper surface of the first electrode, and the third opening exposes an upper surface of the fourth contact electrode.

In some embodiments, the forming a piezoelectric sensing assembly on the first electrode comprises: transferring a piezoelectric thin film unit into the second opening, the piezoelectric thin film unit comprising a stack layer of an anode, a piezoelectric thin film, and a cathode, the piezoelectric thin film being located between the anode and the cathode; and electrically connecting the anode of the piezoelectric thin film unit with the first electrode, and electrically connecting the cathode of the piezoelectric thin film unit with the fourth contact electrode.

In some embodiments, the method of manufacturing the piezoelectric sensor further comprises: coating solder paste at the second opening and at the third opening before the piezoelectric thin film unit is transferred to the second opening; and performing reflow soldering treatment on the first electrode and the piezoelectric thin film unit after the piezoelectric thin film unit is transferred into the second opening.

According to another aspect of the embodiments of the present disclosure, there is provided a detection device. The detection device comprises the piezoelectric sensor according to any of the above.

Further features and aspects of the present disclosure and advantages thereof will become apparent from the following detailed description of exemplary embodiments thereof, which proceeds with reference to the accompanying drawings.

BRIEF DESCRIPTION OF THE DRAWINGS

The accompanying drawings, which constitute a part of this specification, illustrate exemplary embodiments of the present disclosure and, together with the description, serve to explain the principles of the present disclosure.

The present disclosure can be more clearly understood according to the following detailed description made with reference to the drawings, in which:

FIG. 4 is a schematic flow diagram of a manufacture method of a piezoelectric sensor according to an embodiment of the present disclosure;

It should be understood that sizes of various portions shown in the drawings are not necessarily drawn to actual scale. Furthermore, identical or similar reference numerals denote identical or similar members.

DETAILED DESCRIPTION

Figure 1:
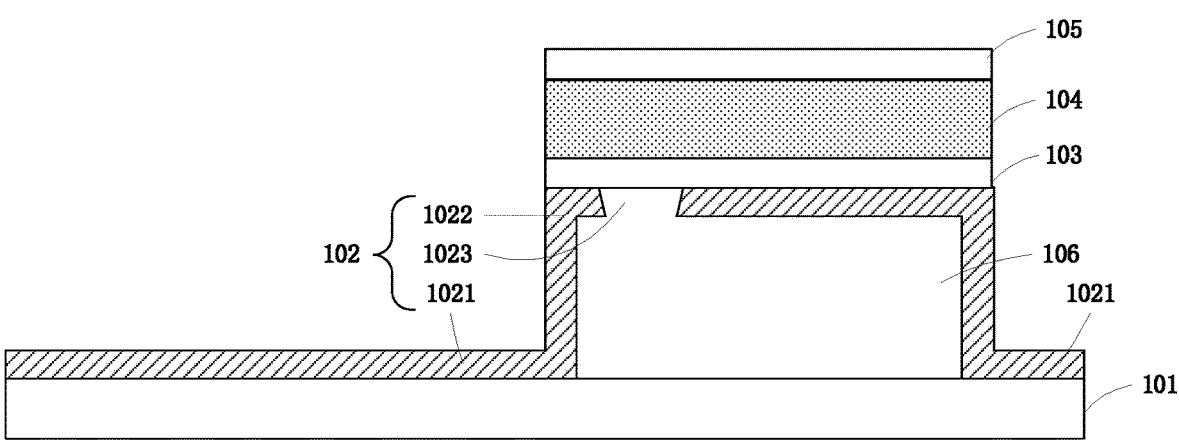
FIG. 1 is a schematic diagram illustrating a structure of a piezoelectric sensor according to an embodiment of the present disclosure.

Various exemplary embodiments of the present disclosure will now be described in detail with reference to the accompanying drawings. The description of the exemplary embodiments is merely illustrative and is in no way intended to limit this disclosure and its application or use. The present disclosure can be implemented in many different forms and is not limited to the embodiments described herein. These embodiments are provided so that this disclosure will be thorough and complete, and the scope of this disclosure will be fully conveyed to those skilled in the art. It should be noted that: relative arrangements of components and steps, composition of materials, numerical expressions and numerical values set forth in these embodiments should be construed as merely exemplary, not as a limitation, unless otherwise specified.

Words "First", "second", and the like used in this disclosure are not intended to indicate any sequence, number, or importance, but are only used for distinguishing different portions. Words "comprise", "include", or the like, mean that an element preceding the word covers an element listed following the word, and does not exclude the possibility of covering another element as well. "Above", "below", and the like are used only for indicating relative position relations, and after an absolute position of a described object changes, its relative position relation possibly changes accordingly.

In the present disclosure, when it is described that a specific component is located between a first component and a second component, an intermediate component may exist between the specific component and the first component or the second component, or no intermediate component may exist. When it is described that a specific component is connected with another component, the specific component may be directly connected with the another component without an intermediate component, or may not be directly connected with the another component but with an intermediate component.

All terms (comprising technical or scientific terms) used in the present disclosure have the same meanings as those understood by one of ordinary skill in the art to which this disclosure belongs unless otherwise specifically defined. It should be also understood that terms defined in for example a common dictionary should be interpreted as having meanings that are consistent with their meanings in the context of the related technology and should not be interpreted with idealized or extremely formalized meanings unless expressly so defined herein.

Techniques, methods, and devices known to one of ordinary skill in the related art may not be discussed in detail but are intended to be part of the specification where appropriate.

In the related art, a piezoelectric sensor has a piezoelectric sensing unit comprising a piezoelectric thin film, upper and lower electrodes, and a cavity. In a manufacture process, the piezoelectric sensing unit is first manufactured by using a silicon-based process, and then the complete piezoelectric sensing unit is transferred onto an array substrate of the piezoelectric sensor. The manufacture of the piezoelectric sensing unit generally needs processes such as thermal oxidation layer growth and the like, which requires a high temperature and complex procedure.

In view of this, the present disclosure provides a new piezoelectric sensor structure and a manufacture method thereof.

FIG. 1 is a schematic diagram illustrating a structure of a piezoelectric sensor according to an embodiment of the present disclosure.

As shown in FIG. 1, the piezoelectric sensor comprises an array substrate 101, a first capping layer 102, a first electrode 103, a piezoelectric thin film 104, and a second electrode 105.

The first capping layer 102 is located on the array substrate 101. The first capping layer 102 comprises a first portion 1021 and a second portion 1022, wherein the first portion 1021 covers the array substrate 101. A cavity 106 is provided between the second portion 1022 and the array substrate 101, and the second portion 1022 is provided with a first opening. For example, a material of the first capping layer can be silicon oxide.

In some embodiments, a length and width of the cavity can be a micrometer scale. A size of the cavity is related to a resonant frequency. With respect to different target resonant frequencies, the piezoelectric thin film, the first electrode, the second electrode and the first capping layer have corresponding thicknesses, and the cavity has a corresponding size.

The first electrode 103 is located above the first capping layer 102, i.e. on one side of the first capping layer 102 away from the array substrate 101. As shown in FIG. 1, the first electrode 103 is located above the cavity 106, i.e., an orthographic projection of the first electrode 103 on the array substrate 101 overlaps at least partially an orthographic projection of the cavity 106 on the array substrate 101. In some embodiments, an area of the orthographic projection of the first electrode 103 on the array substrate 101 is greater than or equal to an area of the orthographic projection of the cavity 106 on the array substrate 101.

The piezoelectric thin film 104 is located on the first electrode 103, i.e. on one side of the first electrode 103 away from the cavity 106. In some embodiments, an area of the orthographic projection of the piezoelectric thin film 104 on the array substrate 101 is equal to the area of the orthographic projection of the first electrode 103 on the array substrate 101. Since the greater the area of the piezoelectric thin film in the case of planarization, the larger valid signals received, the piezoelectric thin film 104 completely covering the cavity 106 is more advantageous to increase the valid signals. In some embodiments, the area of the orthographic projection on the array substrate 101 is greater than the area of the orthographic projection of the cavity 106 on the array substrate 101.

As shown in FIG. 1, the second electrode 105 is located on the piezoelectric thin film 104, i.e. on one side of the piezoelectric thin film 104 away from the first electrode 103. In some embodiments, an area of the orthographic projection of the second electrode 105 on the array substrate 101 is equal to the area of the orthographic projection of the piezoelectric thin film 104 on the array substrate 101.

In some embodiments, the piezoelectric thin film can be a lead zirconate titanate piezoelectric thin film. Because the lead zirconate titanate piezoelectric thin film has a higher piezoelectric constant, the piezoelectric sensor can realize ultrasonic depth detection, that is, ultrasonic waves reflected back from different depths can be received, and depth information is obtained through intensity and time of the reflected signals. It should be understood that the piezoelectric thin film here can be other thin films such as polyvinylidene fluoride.

In some embodiments, a material of the first electrode 205 and the second electrode 212 is indium tin metal oxide (ITO). The first electrode 205 can serve as an anode of a piezoelectric thin film unit, and the second electrode 212 can serve as a cathode of the piezoelectric thin film unit.

Figure 2:
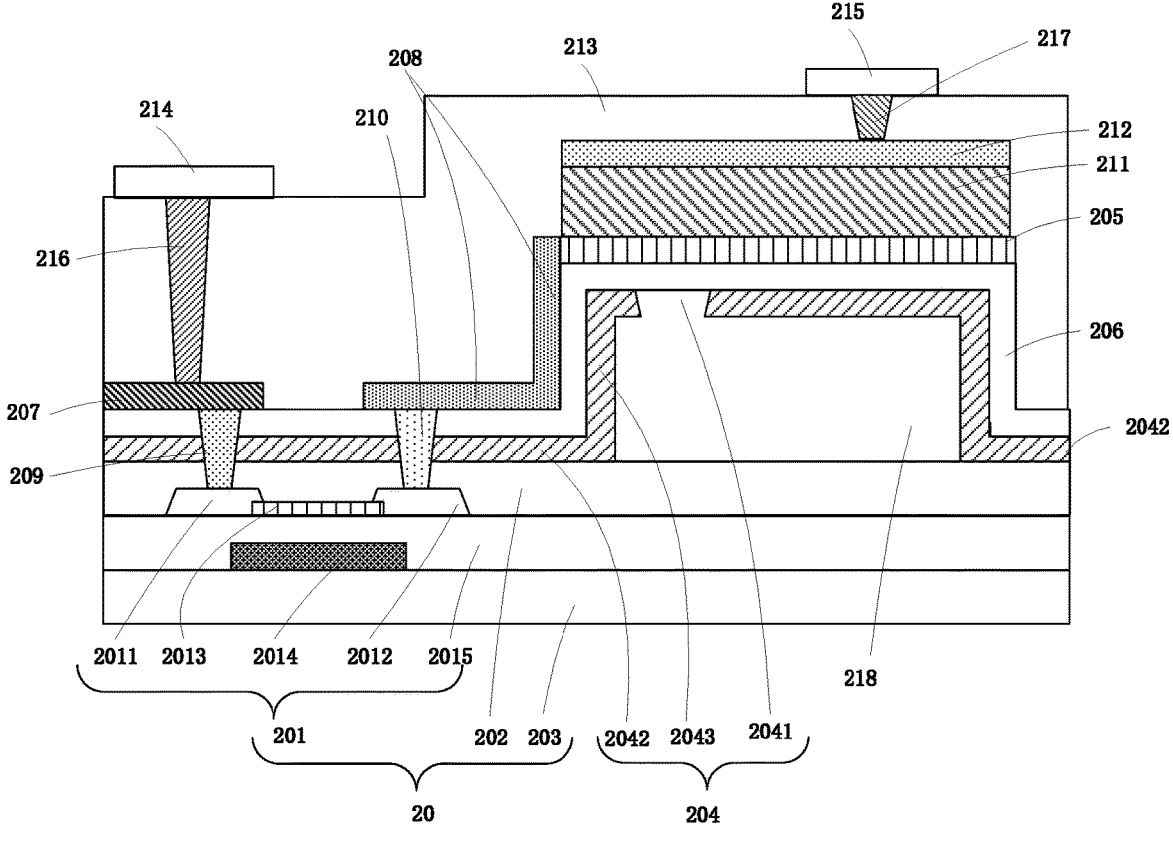
FIG. 2 is a schematic diagram illustrating a structure of a piezoelectric sensor according to another embodiment of the present disclosure.

FIG. 2 is a schematic diagram illustrating a structure of a piezoelectric sensor according to another embodiment of the present disclosure.

Similar to the piezoelectric sensor shown in FIG. 1, the piezoelectric sensor shown in FIG. 2 comprises an array substrate 20, a first capping layer 204, a first electrode 205, a piezoelectric thin film 211, and a second electrode 212. The first capping layer 204 comprising a first portion 2042 and a second portion 2043 and provided with a first opening 2041.

The following description made in conjunction with FIG. 2 focuses on differences between this embodiment and the embodiment shown in FIG. 1, and mutual reference can be made for similarities.

As shown in FIG. 2, the piezoelectric sensor of this embodiment further comprises a second capping layer 206.

The second capping layer 206 is located at least partially between the first capping layer 204 and the first electrode 205. In some implementations, the second capping layer 206 can completely cover the first capping layer 204, i.e., cover all of the first capping layer 204. In other implementations, the second capping layer 206 can cover only a portion of the first capping layer 204 that corresponds to the first electrode 205. For example, a material of the second capping layer 206 can be silicon nitride or silicon oxide. The second capping layer that is disposed on the first capping layer provided with an opening can provide a structural support for the first electrode. In this way, the first electrode has a more complete structure, so that the overall performance of the device can be further improved.

In some embodiments, as shown in FIG. 2, the piezoelectric sensor further comprises first connecting member 207 and a second connecting member 208. The first connecting member 207 is located above the first portion 2042 of the first capping layer 204. That is, the first connecting member 207 can be located on the first portion 2042 of the first capping layer 204 or can be located on the second capping layer 206. The second connecting member 208 is located above the first capping layer 204, electrically connected with the first electrode 205 and electrically insulated from the first connecting member 207. The second connecting member 208 can be connected with the first electrode 205 and spaced apart from the first connecting member 207. For example, the second connecting member 208 has one portion located on the first portion 2042 of the first capping layer 204 and the other portion located on the second portion 2043 of the first capping layer 204 that corresponds to a sidewall of the cavity. It should be understood that the second connecting member 208 can be located on the first capping layer 204, or on the second capping layer 206. Materials of the first connecting member 207, the second connecting member 208 and the first electrode 205 can be the same or different.

In some embodiments, the array substrate comprises a thin film transistor 201 and a first passivation layer 202.

The thin film transistor 201 comprises a third electrode 2011 and a fourth electrode 2012. The third electrode 2011 is electrically connected with the first connecting member 207 through a first contact hole 209, and the fourth electrode 2012 is electrically connected with the second connecting member 208 through a second contact hole 210. The first contact hole 209 and the second contact hole 210 comprise conductive materials filled therein. The materials in the first contact hole 209 and the second contact hole 210 can also be metal, and can be the same as the materials of the first connecting member 207 and the second connecting member 208.

The first passivation layer 202 is located on the thin film transistor 201, i.e., the first passivation layer 202 covers the thin film transistor 201. As shown in FIG. 2, a cavity 218 is located between the first passivation layer 202 and the first capping layer 204. In some embodiments, the first passivation layer 202 can be a stack layer structure of silicon oxide/silicon oxynitride.

In some embodiments, the above piezoelectric sensor further comprises a first planarization layer 213, a first contact electrode 214, and a second contact electrode 215.

The first planarization layer 213 covers the first capping layer 204, the first connecting member 207, the second connecting member 208, the first electrode 205, the piezoelectric thin film 211, and the second electrode 212. A material of the first planarization layer 213 can be a resin material.

The first contact electrode 214 is located on the first planarization layer 213 and electrically connected with the first connecting member 207 through a third contact hole 216. The second contact electrode 215 is located on the first planarization layer 213 and electrically connected with the second electrode 212 through a fourth contact hole 217. For example, materials of the first contact electrode 214 and the second contact electrode 215 can be metal. The third contact hole 216 and the fourth contact hole 217 comprise conductive materials filled therein. The materials in the third contact hole 216 and the fourth contact hole 217 can also be metal, and can be the same as the materials of the first contact electrode 214 and the second contact electrode 215.

Figure 3:
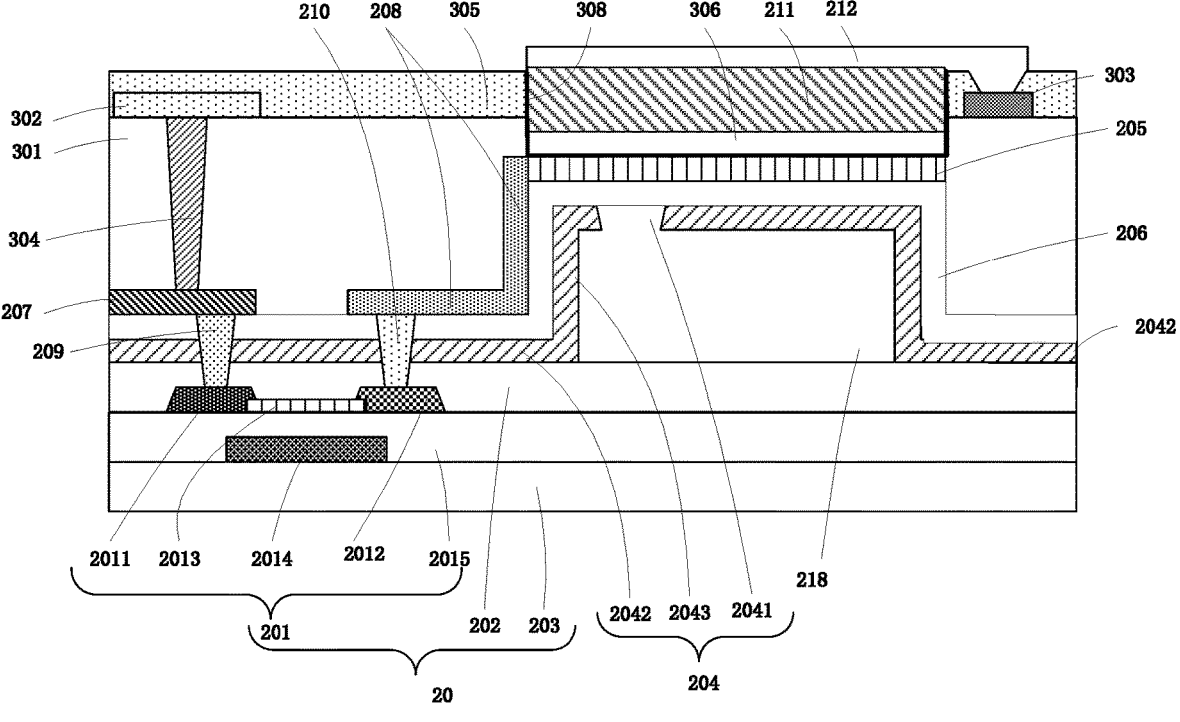
FIG. 3 is a schematic diagram illustrating a structure of a piezoelectric sensor according to still another embodiment of the present disclosure.
Figure 5:
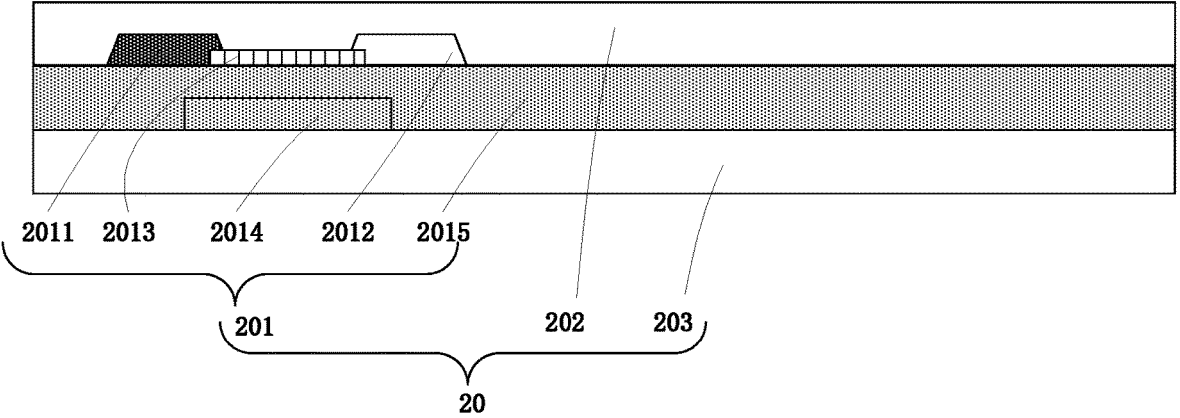
FIGS. 5 to 11B are schematic diagrams illustrating structures obtained at different stages of a manufacture method of a piezoelectric sensor according to some embodiments of the present disclosure.

FIG. 3 is a schematic diagram illustrating a structure of a piezoelectric sensor according to still another embodiment of the present disclosure.

The following description only focuses on differences between the piezoelectric sensor device shown in FIG. 3 and the piezoelectric sensor device shown in FIG. 2, and reference can be made to the above description for similarities.

It is noted that a second planarization layer 301, a third contact electrode 302 and a fourth contact electrode 303 of the piezoelectric sensor in this embodiment correspond to the first planarization layer 213, the first contact electrode 214 and the second contact electrode 215 of the piezoelectric sensor device shown in FIG. 2, respectively. That is, the second planarization layer 301 has the same function in the piezoelectric sensor as the first planarization layer 213, the third contact electrode 302 has the same function in the piezoelectric sensor as the first contact electrode 214, and the fourth contact electrode 303 has the same function in the piezoelectric sensor as the second contact electrode 215. The terms are distinguished herein just for ease of description.

Compared with the embodiment shown in FIG. 2, this embodiment is different in that: the piezoelectric sensor shown in FIG. 3 further comprises a fifth electrode 306 and a second passivation layer 305.

As shown in FIG. 3, the fifth electrode 306 is located between the first electrode 205 and the piezoelectric thin film 211. The second planarization layer 301 is located above the first electrode 205, the first connecting member 207, the second connecting member 208, and the first capping layer 204. For example, the second planarization layer 301 can be located on the first electrode 205, the first connecting member 207, the second connecting member 208, and the first capping layer 204. For another example, the second planarization layer 301 can be located on the first electrode 205, the first connecting member 207, the second connecting member 208, and the second capping layer 206, wherein the second capping layer 206 covers the first capping layer 204. The second passivation layer 305 is located on the second planarization layer 301. The second passivation layer 305 and the second planarization layer 301 are provided with a second opening 308. The second opening 308 exposes an upper surface of the first electrode 205. The third contact electrode 302 is located on the second planarization layer 301 and electrically connected with the first connecting member 207 through a fifth contact hole 304. The fourth contact electrode 303 is located on the second planarization layer 301 and electrically connected with the second electrode 212.

In addition to the above differences, considering the problem of lattice matching, the material of the second electrode 212 and the fifth electrode 306 can be platinum. In this way, a hybrid electrode composed of the first electrode 205 and the fifth electrode 306 can reduce a leakage current caused by the first electrode material of indium tin metal oxide. Here, the fifth electrode 306 can serve as an anode of the piezoelectric thin film 211. The second electrode 212 can serve as a cathode of the piezoelectric thin film 211. The fifth electrode 306 can be electrically connected with the thin film transistor 201 through the first electrode 205.

An embodiment of the present disclosure also provides a detection device. The detection device comprises the piezoelectric sensor in any of the above embodiments.

The detection device operates using the piezoelectric sensor in any of the above embodiments, which can be divided into two stages. A first stage is: an ultrasonic transmitting stage, in which a voltage of the first electrode is set to 0v through the first contact electrode and the thin film transistor, and a high-frequency oscillation voltage is input to the second contact electrode, so that the piezoelectric thin film is stimulated to generate an ultrasonic wave. A second stage is: an ultrasonic receiving stage, in which a voltage of the second contact electrode is set to 0v, the piezoelectric thin film vibrates after receiving the ultrasonic wave, and a generated current can be output through the thin film transistor and the first contact electrode.

In a field of skin detection, certain three-dimensional depth information can be collected by ultrasonic detection, for example, thicknesses of skin epidermis and dermis or a length of any subcutaneous distance is measured, and strength of an elastic substance such as collagen can be detected, so that monitoring, diagnosis and treatment with respect to the skin epidermis and dermis can be realized, and information comprising skin texture, pores, vascular lesions, injuries and the like can be fed back. Therefore, the embodiments of the present disclosure can be applied to a professional field such as medical cosmetology and the like to perform research works such as anti-aging, medical cosmetology evaluation and the like.

FIG. 4 is a schematic flow diagram of a manufacture method of a piezoelectric sensor according to an embodiment of the present disclosure. FIGS. 5 to 11B are schematic diagrams illustrating structures obtained at different stages of the manufacture method of the piezoelectric sensor according to FIG. 4.

The manufacture method of the piezoelectric sensor according to some embodiments of the present disclosure will be described below in conjunction with FIGS. 4 and 5 to 11B.

In step S402, an array substrate 20 is formed. The array substrate 20 can comprise a substrate 203, a thin film transistor 201, and a first passivation layer 202. The thin film transistor 201 can comprise a third electrode 2011, an active layer 2013, a fourth electrode 2012, a gate 2014, and an insulating layer 2015. The array substrate 20 can be manufactured as follows, which will be described in detail in conjunction with FIG. 5.

First, the gate 2014 is formed on the substrate 203. For example, the gate 2014 can be formed on a glass substrate 203, or the gate 2014 can be formed on a flexible PI (Polyimide) substrate.

Next, the insulating layer 2015 is formed. For example, the insulating layer 2015 can cover the substrate 203 and the gate 2014.

Next, the active layer 2013 is formed. For example, the active layer 2013 is formed on the insulating layer 2015 and directly above the gate 2014.

Next, the third electrode 2011 and the fourth electrode 2012 are formed. For example, the third electrode 2011 connected with the active layer 2013 is formed on the insulating layer 2015 and on one side of the active layer 2013. The fourth electrode 2012 connected with the active layer 2013 is formed on the insulating layer 2015 and on the other side of the active layer 2013. In some implementations, the third electrode 2011 can be a source of the thin film transistor 201, and the fourth electrode 2012 can be a drain of the thin film transistor 201. In other implementations, the third electrode 2011 can be a drain of the thin film transistor 201, and the fourth electrode 2012 can be a source of the thin film transistor 201.

Next, the first passivation layer 202 is formed. For example, the first passivation layer 202 can cover the thin film transistor 201 to protect the thin film transistor 201.

In step S404, a patterned sacrificial layer 601 is formed on the array substrate.

Figure 6:
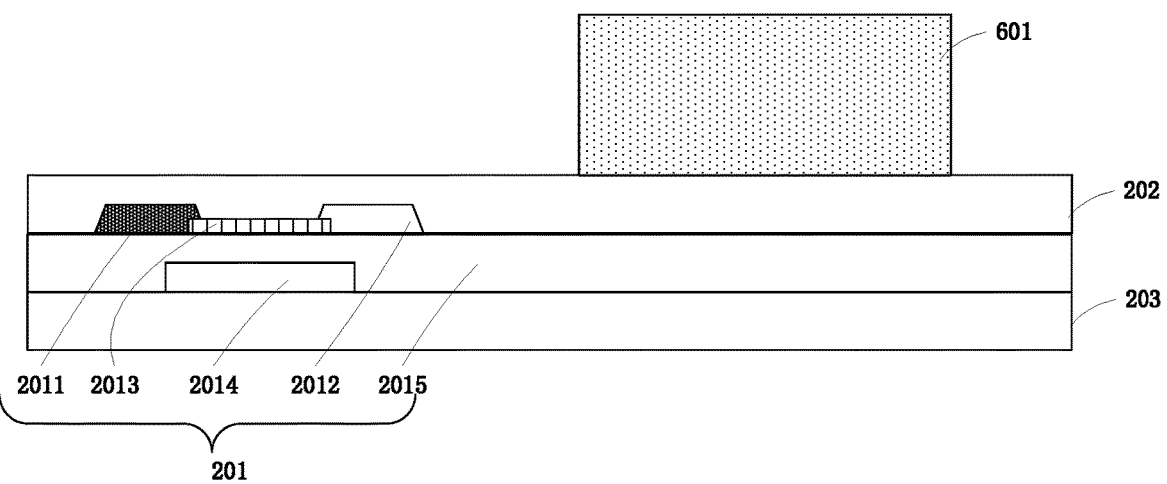

As shown in FIG. 6, for example, a patterned amorphous silicon layer is formed on the first passivation layer 202 as the sacrificial layer 601. A thickness of the amorphous silicon layer can be greater than or equal to 1 micron.

In step S406, a first capping layer 204 is formed on the array substrate and around the sacrificial layer 601, wherein the first capping layer 204 is provided with a first opening 2041 around the sacrificial layer 601.

In some embodiments, first, the first capping layer 204 can be formed on the array substrate and around the sacrificial layer 601 by using plasma enhanced chemical vapor deposition. Next, a portion of the first capping layer 204 that covers around the sacrificial layer 601 is etched off to form the first opening 2041 around the sacrificial layer 601. Here, a process temperature required for the plasma enhanced chemical vapor deposition can be 300 to 400 degrees centigrade. Compared with a process temperature (about 1000 degrees centigrade) required for forming an oxide layer on a silicon substrate in the related art, the embodiment of the present disclosure reduces process difficulty.

Figure 7:
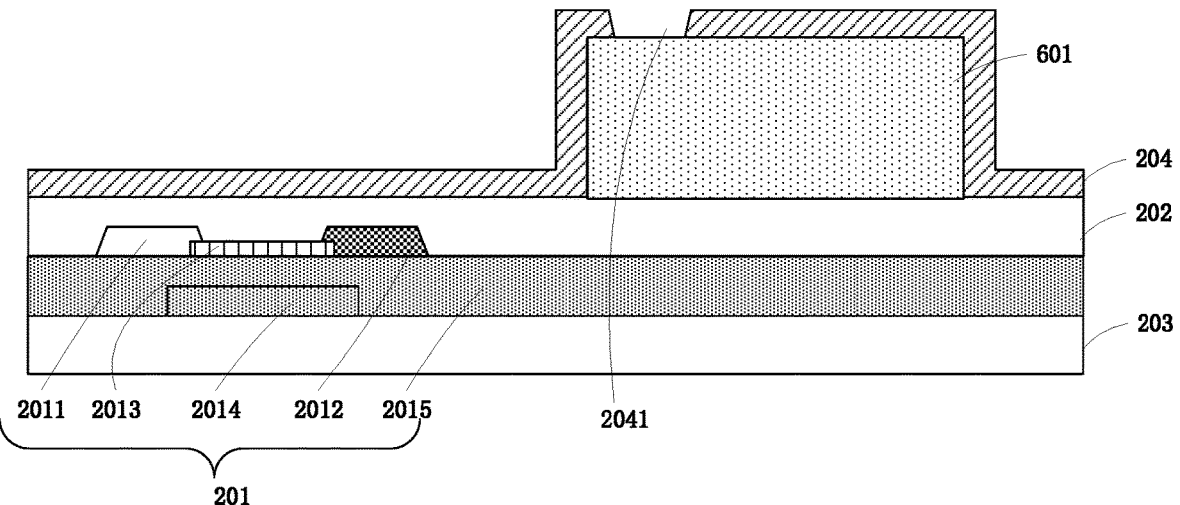

For example, the first capping layer 204 covering on the array substrate and around the sacrificial layer 601 can be first formed by depositing a silicon oxide material by using the plasma enhanced chemical vapor deposition. The first capping layer 204 above the sacrificial layer 601 is partially etched by an etching process to form the first opening 2041 located above the sacrificial layer 601, as shown in FIG. 7.

Figure 8:
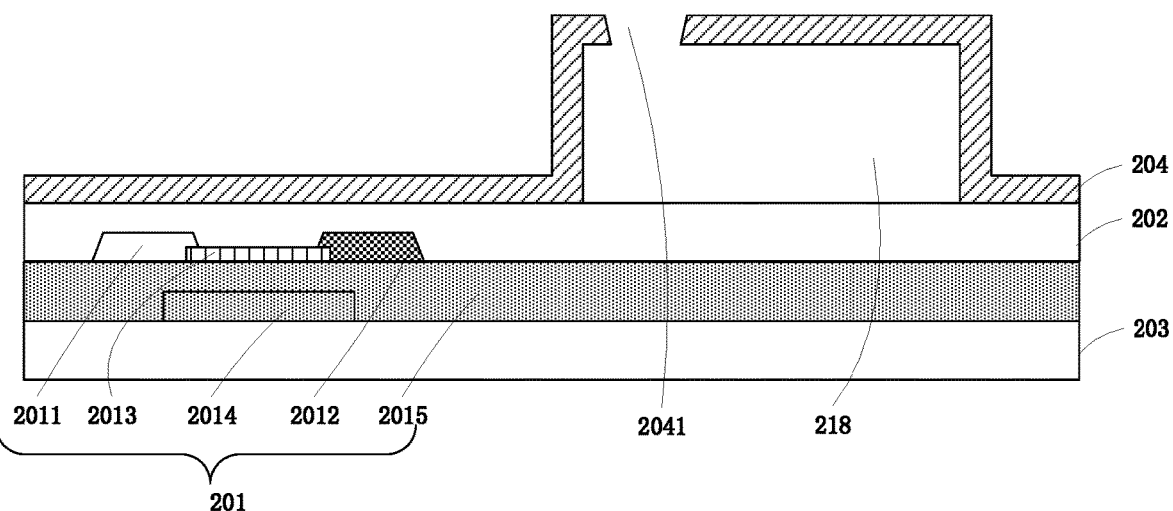

In step S408, the sacrificial layer 601 is etched off through the first opening 2041 by using a wet etching process, to form a cavity 218 between the first capping layer 204 and the array substrate in a region where the sacrificial layer 601 is located, as shown in FIG. 8. For example, the amorphous silicon layer is etched through the first opening 2041 by using a potassium hydroxide solution to form the cavity 218.

Figure 9A:
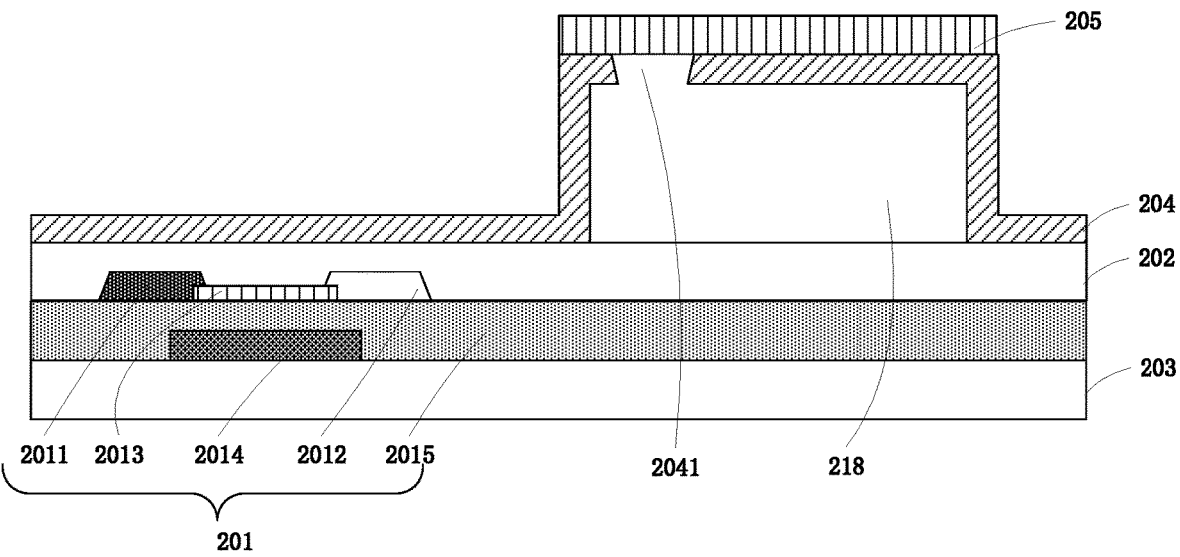

In step S410, a first electrode 205 is formed. The first electrode 205 is located above the first capping layer 204 and above the cavity, as shown in FIG. 9A. For example, the first electrode 205 can be manufactured by depositing an indium tin metal oxide material.

Figure 9B:
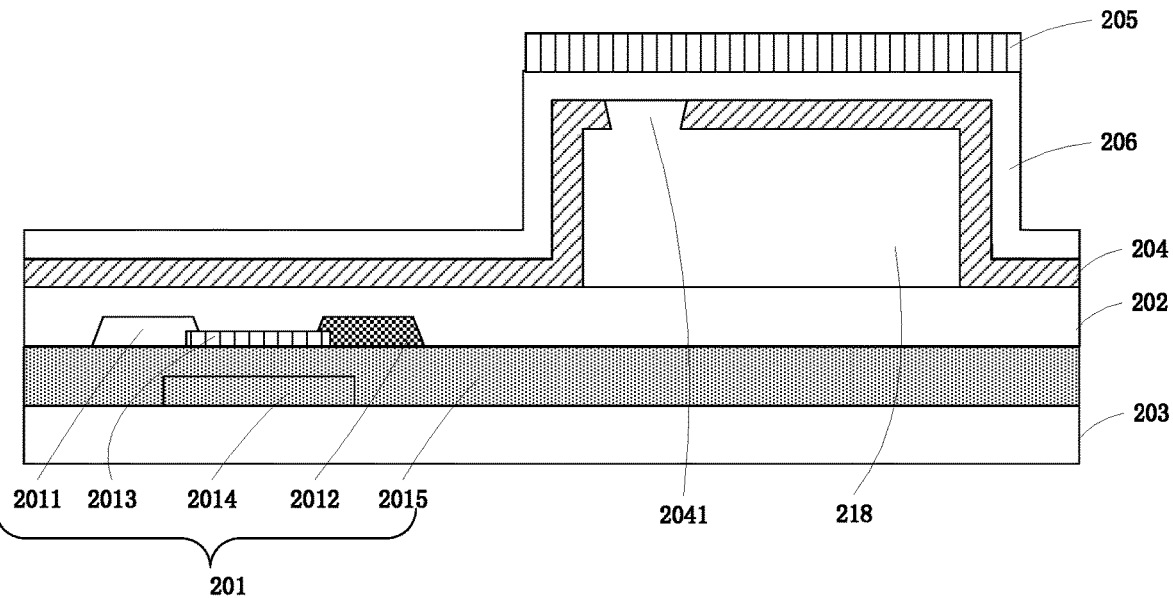

In some embodiments, a second capping layer 206 can be formed before the first electrode 205 is formed. The second capping layer 206 is located at least partially between the first capping layer 204 and the first electrode 205. For example, the second capping layer 206 can be formed by depositing silicon nitride. As shown in FIG. 9B, the second capping layer 206 can completely cover the first capping layer 204. The second capping layer 206 can also cover only the second capping layer 206 corresponding to the first electrode 205. A material of the second capping layer 206 can also be another material such as silicon oxide. In this way, by forming the second capping layer 206 on the first capping layer 204 providing with the first opening above the cavity, an adverse effect caused by a metal material falling into the cavity while the first electrode is formed can be prevented.

Figure 9C:
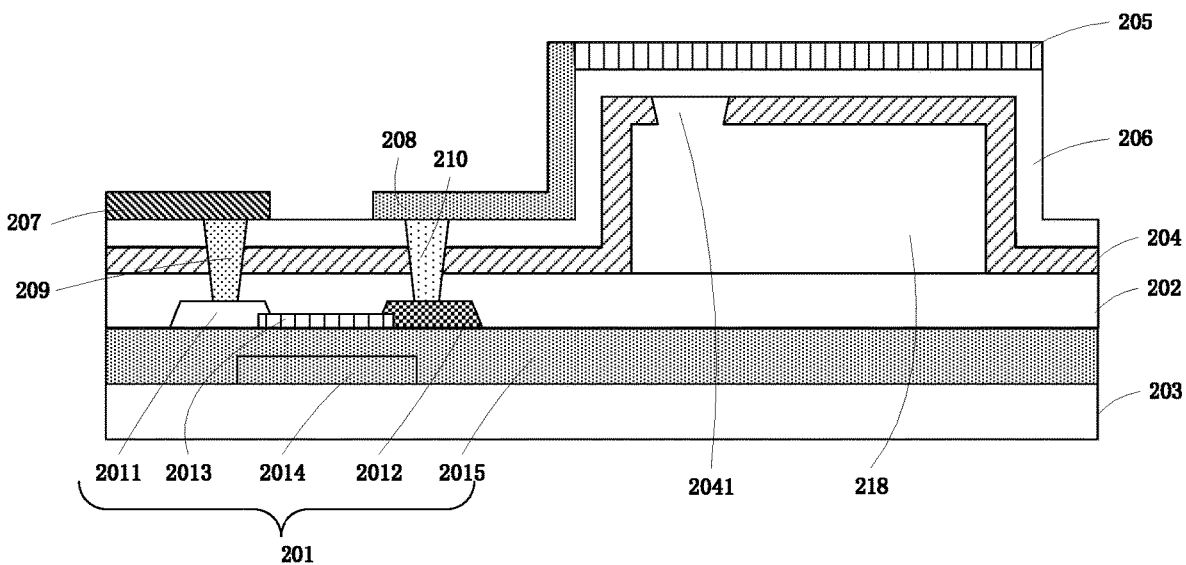

In some embodiments, the method of manufacturing the piezoelectric sensor further comprises the following steps, which will be described in detail below in conjunction with FIG. 9C.

First, the first capping layer 204, the second capping layer 206, and the first passivation layer 202 are etched to form a first contact hole 209 exposing an upper surface of the third electrode 2011 and a second contact hole 210 exposing an upper surface of the fourth electrode 2012.

Next, a first connecting member 207 and a second connecting member 208 are formed on the second capping layer 206. The second connecting member 208 is electrically connected with the first electrode 205 and electrically insulated from the first connecting member 207.

Here, the first connecting member 207 is electrically connected with the third electrode 2011 through the first contact hole 209. The second connecting member 208 is electrically connected with the fourth electrode 2012 through the second contact hole 210. Materials of the first connecting member 207 and the second connecting member 208 and the first electrode 205 can be the same or different.

In some embodiments, the first electrode 205, the first connecting member 207, and the second connecting member 208 can also be formed through a same patterning process. For example, first, the first contact hole 209 and the second contact hole 210 can be filled by depositing an indium tin metal oxide material, and an indium tin metal oxide layer is formed on the second capping layer 206. Next, the first electrode 205, the first connecting member 207, and the second connecting member 208 can be formed by patterning the indium tin metal oxide layer.

In step S412, a piezoelectric sensing assembly is formed on the first electrode 205.

Figure 10A:
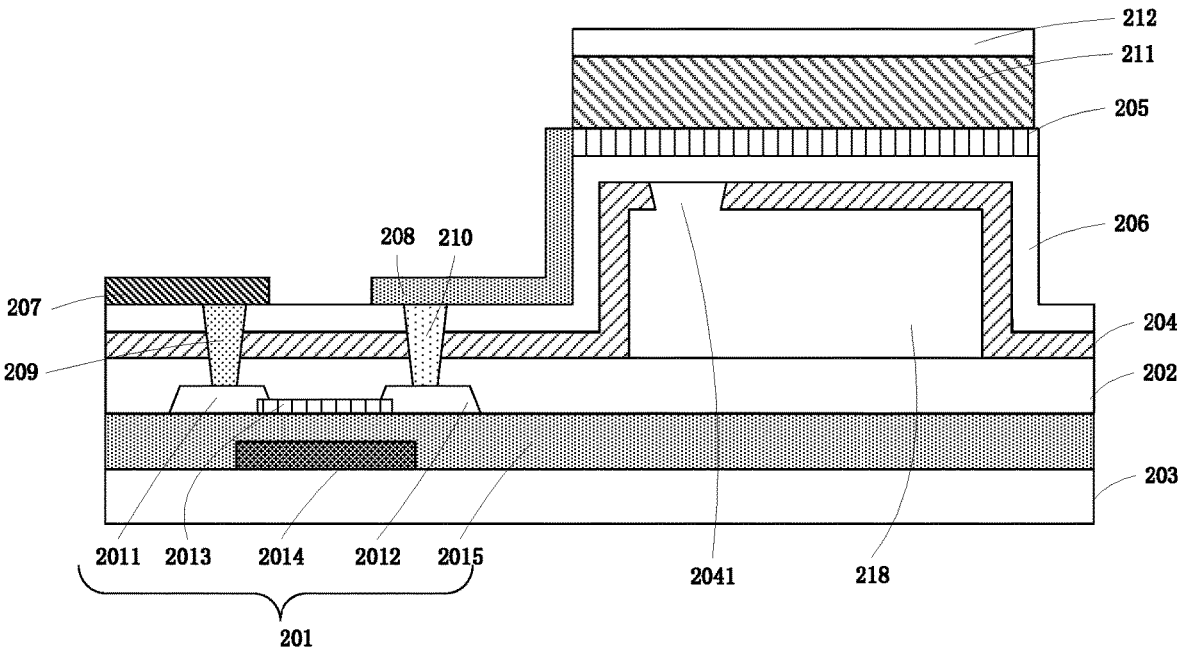
Figure 10B:
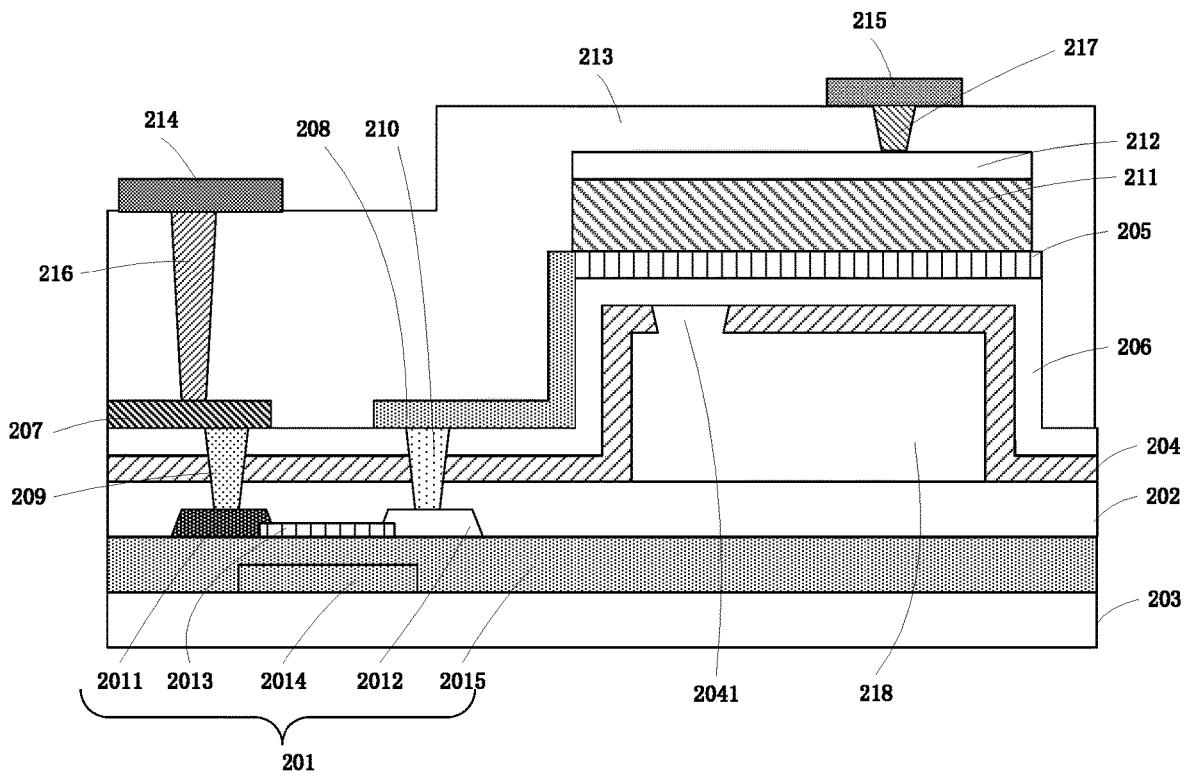

In some embodiments, as shown in FIG. 10A, the piezoelectric sensing assembly can be formed on the first electrode 205 by:

first, the piezoelectric thin film 211 can be formed on the first electrode 205. For example, a lead zirconate titanate thin film can be formed on the first electrode 205 and patterned by using a laser direct writing process.

Next, a second electrode 212 can be formed on the piezoelectric thin film 211.

In some embodiments, after the piezoelectric sensing assembly as shown in FIG. 10A is formed, the method of manufacturing the piezoelectric sensor further comprises the following steps. The detailed description will be made below in conjunction with FIG. 10B.

First, a first planarization layer 213 is formed. The first planarization layer 213 covers the first capping layer 204, the first connecting member 207, the second connecting member 208, the piezoelectric thin film 211, and the second electrode 212.

Next, the first planarization layer 213 can be etched to form a third contact hole 216 and a fourth contact hole 217.

Next, the first contact electrode 214 and the second contact electrode 215 are formed on the first planarization layer 213. The first contact electrode 214 is electrically connected with the first connecting member 207 through the third contact hole 216. The second contact electrode 215 is electrically connected with the second electrode 212 through the fourth contact hole 217. For example: the first contact electrode 214 and the second contact electrode, 215 can be formed on the first planarization layer 213 by sputtering a metal material.

By using the manufacture method of the above embodiment, the transfer of the piezoelectric sensing unit onto the array substrate by means of a transfer process can be avoided. By directly manufacturing the piezoelectric sensing unit on the array substrate, the process can be simplified, and the product yield is effectively improved.

Figure 11A:
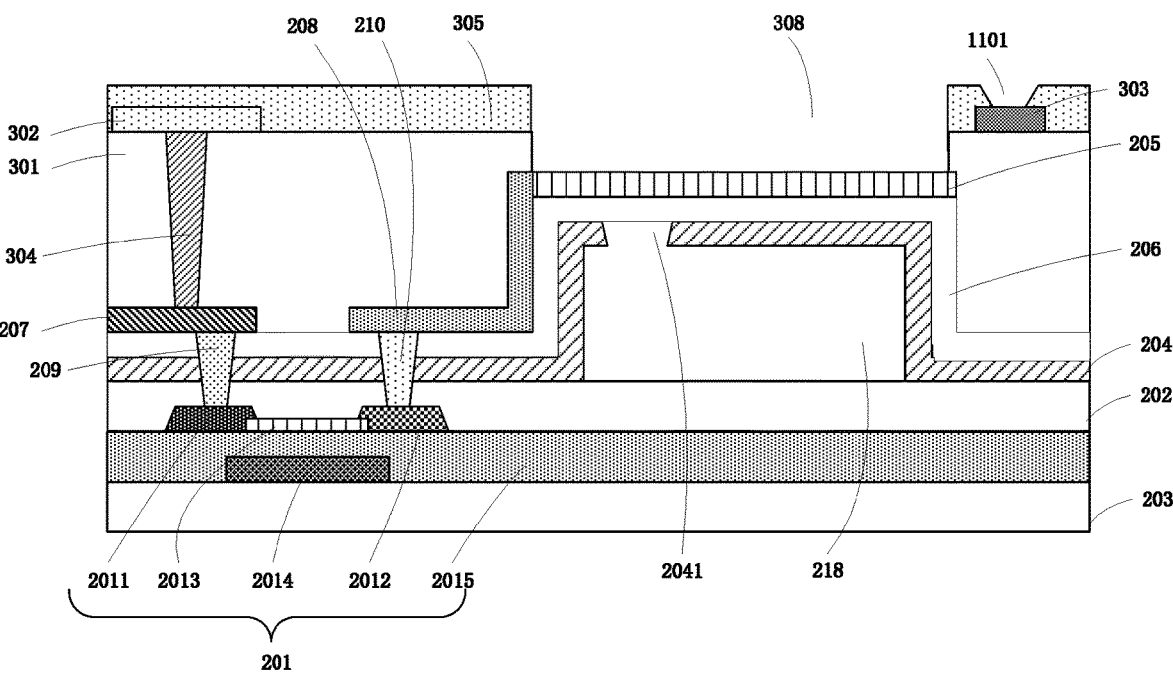
Figure 11B:
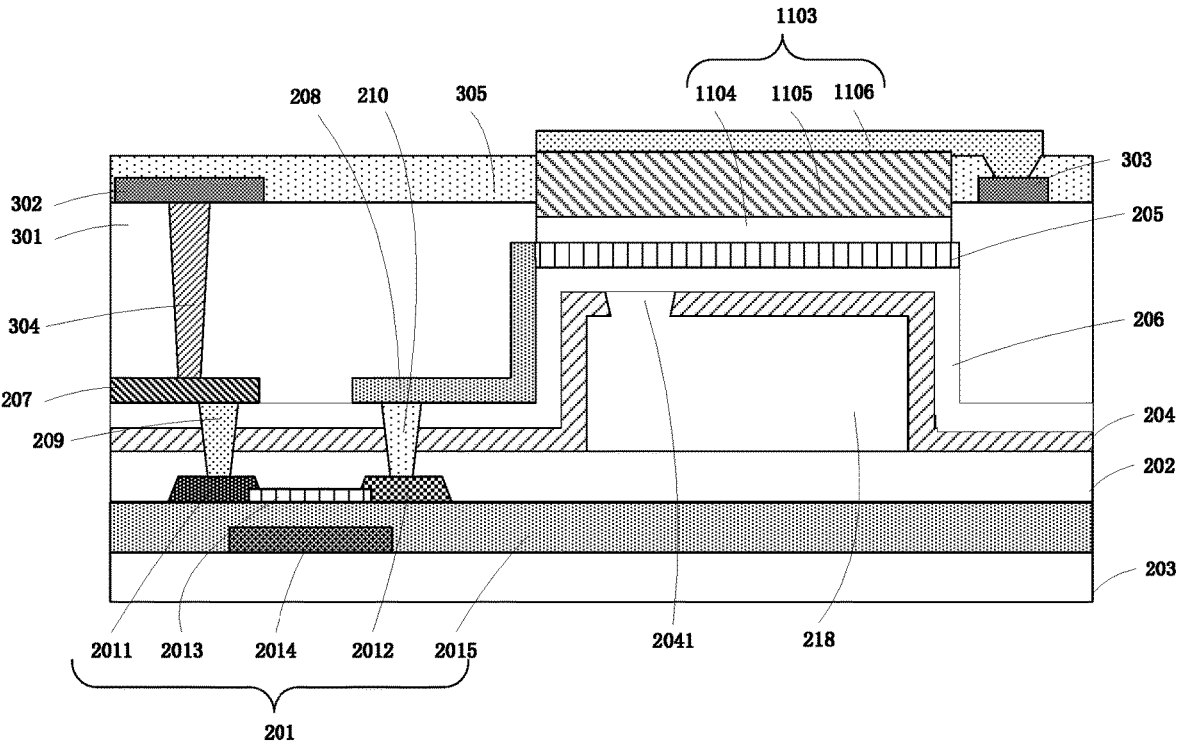

In other embodiments, as shown in FIG. 11A, before the piezoelectric sensing assembly is formed on the first electrode 205, the method of manufacturing the piezoelectric sensor further comprises the following steps.

First, a second planarization layer 301 can be formed. The second planarization layer 301 is located above the first electrode 205, the first connecting member 207, the second connecting member 208, and the first capping layer 204.

Next, the second planarization layer 301 can be etched to form a fifth contact hole 304.

Next, a third contact electrode 302 and a fourth contact electrode 303 can be formed on the second planarization layer 301. For example: the third contact electrode 302 and the fourth contact electrode 303 can be formed on the second planarization layer 301 by sputtering a metal material. The third contact electrode 302 is electrically connected with the first connecting member 207 through the fifth contact hole 304. The fourth contact electrode 303 is electrically insulated from the third contact electrode 302.

Next, a second passivation layer 305 can be formed. The second passivation layer 305 covers the second planarization layer 301, the third contact electrode 302 and the fourth contact electrode 303.

Next, the second planarization layer 301 and the second passivation layer 305 can be etched to form a second opening 308 and a third opening 1101. Here, the second opening 308 exposes an upper surface of the first electrode 205. The third opening 1101 exposes an upper surface of the fourth contact electrode 303.

In some embodiments, after the structure shown in FIG. 11A is formed, the forming a piezoelectric sensing assembly on the first electrode 205 further comprises the following steps. The detailed description will be made below in conjunction with FIG. 11B.

First, a piezoelectric thin film unit 1103 can be transferred into the second opening. The piezoelectric thin film unit 1103 comprises a stack layer of an anode 1104, a piezoelectric thin film 1105, and a cathode 1106. The piezoelectric thin film 1105 is located between the anode 1104 and cathode 1106.

Next, the anode 1104 of the piezoelectric thin film unit 1103 can be electrically connected with the first electrode 205, and the cathode 1106 of the piezoelectric thin film unit 1103 can be electrically connected with the fourth contact electrode 303. In this way, the anode 1104 of the piezoelectric thin film unit 1103 can be electrically connected with the fourth electrode 2012 of the thin film transistor 201 through the first electrode 205.

In some embodiments, the method of manufacturing the piezoelectric sensor further comprises the following steps. Before the piezoelectric thin film unit 1103 is transferred to the second opening, solder paste is coated at the second opening and at the third opening. After the piezoelectric thin film unit 1103 is transferred into the second opening, reflow soldering treatment is performed on the first electrode 205 and the piezoelectric thin film unit 1103. In this way, the piezoelectric thin film unit 1103 is fixed on the first electrode 205, and the anode 1104 thereof can be electrically connected with the first electrode 205 and the cathode 1106 thereof can be electrically connected with the fourth contact electrode 303.

By using the manufacture method of the above embodiment, the cavity can be directly formed on the array substrate, compared with a method of manufacturing a cavity by using a silicon-based process in the related art, the process adopted by the embodiment of the present disclosure can reduce the process difficulty, and the cavity structure obtained by the above manufacture method using the array process can have higher resolution.

Thus far, various embodiments of the present disclosure have been described in detail. Some details well known in the art have not been described in order to avoid obscuring the concepts of the present disclosure. Those skilled in the art can now fully appreciate how to implement the technical solutions disclosed herein, in view of the foregoing description.

Although some specific embodiments of the present disclosure have been described in detail by way of examples, it should be understood by those skilled in the art that the above examples are for illustration only and are not intended to limit the scope of the present disclosure. It should be understood by those skilled in the art that modification can be made to the above embodiments or equivalent replacements can be made to some technical features without departing from the scope and spirit of the present disclosure. The scope of the present disclosure is defined by the attached claims.

What is claimed is:

1. A piezoelectric sensor, comprising:
an array substrate;
a first capping layer located on the array substrate and comprising a first portion and a second portion, wherein the first portion covers the array substrate, a cavity is provided between the second portion and the array substrate, and the second portion is provided with a first opening;
a first electrode located above the first capping layer and above the cavity;
a second capping layer located at least partially between the first capping layer and the first electrode, wherein the second capping layer completely covers the first capping layer;
a piezoelectric thin film located on the first electrode; and
a second electrode located on the piezoelectric thin film.

2. The piezoelectric sensor according to claim 1, wherein:
a material of the first electrode and the second electrode is indium tin metal oxide (ITO); and/or
the piezoelectric thin film is a lead zirconate titanate piezoelectric thin film.

3. The piezoelectric sensor according to claim 1, wherein a material of the first capping layer is silicon oxide, and a material of the second capping layer is silicon nitride.

4. A detection device, comprising the piezoelectric sensor according to any of claim 1.

5. The piezoelectric sensor according to claim 1, further comprising:
a fifth electrode located between the first electrode and the piezoelectric thin film.

6. The piezoelectric sensor according to claim 5, further comprising:
a second planarization layer located above the first electrode, the first connecting member, the second connecting member, and the first capping layer;
a second passivation layer located on the second planarization layer, the second passivation layer and the second planarization layer being provided with a second opening, the second opening exposing an upper surface of the first electrode;

a third contact electrode located on the second planarization layer and electrically connected with the first connecting member through a fifth contact hole; and
a fourth contact electrode located on the second planarization layer and electrically connected with the second electrode.

7. The piezoelectric sensor according to claim 6, wherein a material of the first electrode is indium tin metal oxide, and a material of the second electrode and the fifth electrode is platinum.

8. The piezoelectric sensor according to claim 1, further comprising:
a first connecting member located above the first portion of the first capping layer; and
a second connecting member located above the first capping layer, electrically connected with the first electrode, and electrically insulated from the first connecting member,
wherein the array substrate comprises a thin film transistor and a first passivation layer located on the thin film transistor, the thin film transistor comprises a third electrode and a fourth electrode, the cavity is located between the first passivation layer and the first capping layer, the third electrode is electrically connected with the first connecting member through a first contact hole, and the fourth electrode is electrically connected with the second connecting member through a second contact hole.

9. The piezoelectric sensor according to claim 8, wherein the first passivation layer comprises a stack layer structure of silicon oxide and silicon oxynitride.

10. The piezoelectric sensor according to claim 8, further comprising:
a first planarization layer covering the first capping layer, the first connecting member, the second connecting member, and the second electrode;
a first contact electrode located on the first planarization layer and electrically connected with the first connecting member through a third contact hole; and
a second contact electrode located on the first planarization layer and electrically connected with the second electrode through a fourth contact hole.

11. A method of manufacturing a piezoelectric sensor, comprising:
forming an array substrate;
forming a patterned sacrificial layer on the array substrate;
forming a first capping layer on the array substrate and around the sacrificial layer, the first capping layer being provided with a first opening around the sacrificial layer;
etching off the sacrificial layer through the first opening by using a wet etching process, to form a cavity between the first capping layer and the array substrate, in a region where the sacrificial layer is located;
forming a first electrode that is located above the first capping layer and above the cavity;
forming a second capping layer that is located at least partially between the first capping layer and the first electrode, wherein the second capping layer completely covers the first capping layer; and
forming a piezoelectric sensing assembly on the first electrode.

12. The method of manufacturing the piezoelectric sensor according to claim 11, wherein the forming a first capping layer on the array substrate and around the sacrificial layer comprises:

forming the first capping layer on the array substrate and around the sacrificial layer by using plasma enhanced chemical vapor deposition.

13. The method of manufacturing the piezoelectric sensor according to claim 11, wherein the forming a piezoelectric sensing assembly on the first electrode comprises:

forming a piezoelectric thin film on the first electrode; and forming a second electrode on the piezoelectric thin film.

14. The method of manufacturing the piezoelectric sensor according to claim 11, wherein the array substrate comprises a thin film transistor and a first passivation layer located on the thin film transistor, the thin film transistor comprises a third electrode and a fourth electrode, and the cavity is located between the first passivation layer and the first capping layer, and the method of manufacturing the piezoelectric sensor further comprises:

etching the first capping layer, the second capping layer and the first passivation layer to form a first contact hole exposing an upper surface of the third electrode and a second contact hole exposing an upper surface of the fourth electrode; and forming a first connecting member and a second connecting member on the second capping layer, the first connecting member being electrically connected with the third electrode through the first contact hole, the second connecting member being electrically connected with the first electrode and electrically insulated from the first connecting member, the second connecting member being electrically connected with the fourth electrode through the second contact hole.

15. The method of manufacturing the piezoelectric sensor according to claim 14, wherein the first electrode, the first connecting member, and the second connecting member are formed by a same patterning process.

16. The method of manufacturing the piezoelectric sensor according to claim 14, further comprises:

forming a first planarization layer that covers the first capping layer, the first connecting member, the second connecting member, and the piezoelectric sensing assembly;

etching the first planarization layer to form a third contact hole and a fourth contact hole; and forming a first contact electrode and a second contact electrode on the first planarization layer, the first contact electrode being electrically connected with the first connecting member through the third contact hole, the second contact electrode being electrically connected with the second electrode through the fourth contact hole.

17. The method of manufacturing the piezoelectric sensor according to claim 11, further comprising:

forming a second planarization layer that is located above the first electrode, the first connecting member, the second connecting member, and the first capping layer;

etching the second planarization layer to form a fifth contact hole;

forming a third contact electrode and a fourth contact electrode on the second planarization layer, the third contact electrode being electrically connected with the first connecting member through the fifth contact hole, the fourth contact electrode being electrically insulated from the third contact electrode;

forming a second passivation layer that covers the second planarization layer, the third contact electrode and the fourth contact electrode; and etching the second planarization layer and the second passivation layer to form a second opening and a third opening, wherein the second opening exposes an upper surface of the first electrode, and the third opening exposes an upper surface of the fourth contact electrode.

18. The method of manufacturing the piezoelectric sensor according to claim 17, wherein the forming a piezoelectric sensing assembly on the first electrode comprises:

transferring a piezoelectric thin film unit into the second opening, the piezoelectric thin film unit comprising a stack layer of an anode, a piezoelectric thin film, and a cathode, the piezoelectric thin film being located between the anode and the cathode; and electrically connecting the anode of the piezoelectric thin film unit with the first electrode, and electrically connecting the cathode of the piezoelectric thin film unit with the fourth contact electrode.

19. The method of manufacturing the piezoelectric sensor according to claim 18, further comprising:

coating solder paste at the second opening and at the third opening before the piezoelectric thin film unit is transferred to the second opening; and performing reflow soldering treatment on the first electrode and the piezoelectric thin film unit after the piezoelectric thin film unit is transferred into the second opening.

* * * * *